United States Patent
Cudzinovic et al.

(10) Patent No.: US 10,164,131 B2
(45) Date of Patent: Dec. 25, 2018

(54) MULTI-LAYER SPUTTERED METAL SEED FOR SOLAR CELL CONDUCTIVE CONTACT

(71) Applicant: SUNPOWER CORPORATION, San Jose, CA (US)

(72) Inventors: Michael Cudzinovic, Sunnyvale, CA (US); Amjad Deyine, Paris (FR); Robert Woehl, San Jose, CA (US)

(73) Assignees: SunPower Corporation, San Jose, CA (US); Total Marketing Services, Puteaux (FR)

( * ) Notice: Subject to any disclaimer, the term of this patent is extended or adjusted under 35 U.S.C. 154(b) by 696 days.

(21) Appl. No.: 14/578,204

(22) Filed: Dec. 19, 2014

(65) Prior Publication Data

US 2016/0181450 A1  Jun. 23, 2016

(51) Int. Cl.
*H01L 31/0224* (2006.01)
*H01L 31/068* (2012.01)

(52) U.S. Cl.
CPC ........ *H01L 31/022441* (2013.01); *H01L 31/022425* (2013.01); *H01L 31/0682* (2013.01); *Y02E 10/547* (2013.01)

(58) Field of Classification Search
CPC .... H01L 31/028; H01L 31/036; H01L 31/018
See application file for complete search history.

(56) References Cited

U.S. PATENT DOCUMENTS

| | | | |
|---|---|---|---|
| 2008/0216887 A1 | 9/2008 | Hacke et al. | |
| 2012/0204938 A1 | 8/2012 | Hacke et al. | |
| 2014/0360567 A1* | 12/2014 | Seutter | H01B 1/023 136/256 |

FOREIGN PATENT DOCUMENTS

WO    WO2014011260 A2 *  1/2014

* cited by examiner

*Primary Examiner* — Tae-Sik Kang
(74) *Attorney, Agent, or Firm* — Schwabe, Williamson & Wyatt, P.C.

(57) ABSTRACT

Multi-layer sputtered metal seed for solar cell conductive contacts and methods of forming solar cell conductive contacts are described. In an example, a solar cell includes a substrate. A semiconductor region is disposed in or above the substrate. A conductive contact is disposed on the semiconductor region and includes a seed material stack in contact with the semiconductor region. The seed material stack includes a first aluminum layer having a first crystallinity and disposed on the semiconductor layer, and a second aluminum layer having a second crystallinity and disposed on and having an interface with the first aluminum layer. The first crystallinity is different from the second crystallinity.

8 Claims, 9 Drawing Sheets

US 10,164,131 B2

MULTI-LAYER SPUTTERED METAL SEED FOR SOLAR CELL CONDUCTIVE CONTACT

TECHNICAL FIELD

Embodiments of the present disclosure are in the field of renewable energy and, in particular, multi-layer sputtered metal seed for solar cell conductive contacts and methods of forming solar cell conductive contacts.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1A-1E illustrate cross-sectional views of various operations in a method of fabricating a conductive contact for a solar cell, in accordance with an embodiment of the present disclosure, wherein:

FIG. 1A illustrates a stage in solar cell fabrication following sputtering of a first conductive seed layer on a semiconductor region disposed in or above a substrate;

FIG. 1B illustrates the structure of FIG. 1A following sputtering of a second conductive seed layer on the first conductive seed layer;

FIG. 1C illustrates the structure of FIG. 1B following sputtering of a third conductive seed layer on the second conductive seed layer;

FIG. 1D illustrates the structure of FIG. 1C following annealing of the first, second, and third conductive seed layers; and FIG. 1E illustrates the structure of FIG. 1D following forming of a conductive contact for the semiconductor region of the solar cell, the conductive contact including the first, second, and third conductive seed layers.

DETAILED DESCRIPTION

Figure 1A:
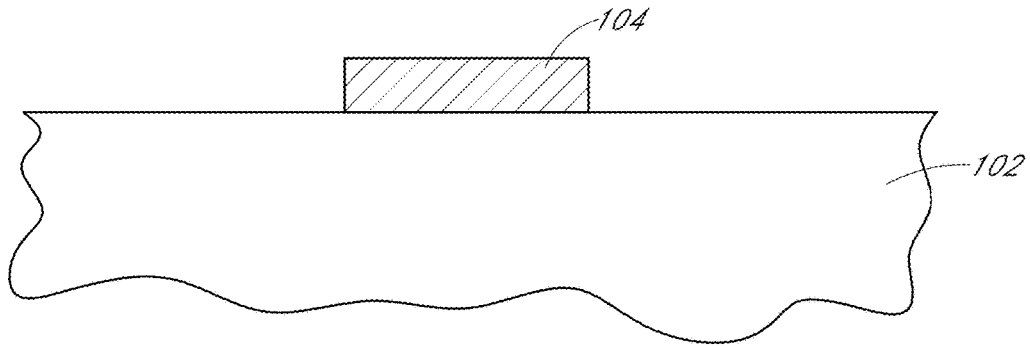

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Multi-layer sputtered metal seed for solar cell conductive contacts and methods of forming solar cell conductive contacts are described herein. In the following description, numerous specific details are set forth, such as specific material regimes and process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell involves sputtering a first conductive seed layer on a semiconductor region disposed in or above a substrate, the first conductive seed layer including a majority of a first metal species. The method also involves sputtering a second conductive seed layer on the first conductive seed layer, the second conductive seed layer including a majority of the first metal species and forming a crystalline interface with the first conductive seed layer. The method also involves sputtering a third conductive seed layer on the second conductive seed layer, the third conductive seed layer including a majority of a second, different, metal species. The method also involves annealing the first, second, and third conductive seed layers, wherein the annealing drives the second metal species from the third conductive seed layer into the second conductive seed layer but essentially not into the first conductive seed layer. The method also involves forming a conductive contact for the semiconductor region of the solar cell including the first, second, and third conductive seed layers.

Also disclosed herein are solar cells. In one embodiment, a solar cell includes a substrate. A semiconductor region is disposed in or above the substrate. A conductive contact is disposed on the semiconductor region and includes a seed material stack in contact with the semiconductor region. The seed material stack includes a first aluminum layer having a first crystallinity and disposed on the semiconductor layer, and a second aluminum layer having a second crystallinity and disposed on and having an interface with the first aluminum layer. The first crystallinity is different from the second crystallinity.

In another embodiment, a solar cell includes a substrate. A semiconductor region is disposed in or above the substrate. A conductive contact is disposed on the semiconductor region and includes a seed material stack in contact with the semiconductor region. The seed material stack includes a first conductive layer having a majority of a first metal species and disposed on the semiconductor region. The seed material stack also includes a second conductive layer having a majority of the first metal species and disposed on and having a crystalline interface with the first conductive layer. The seed material stack includes a third conductive layer having a majority of a second, different, metal species and disposed on the second conductive layer. The second conductive layer further includes the second metal species but the first conductive layer is essentially free from the second metal species.

In another embodiment, a solar cell includes a substrate. A semiconductor region is disposed in or above the substrate. A conductive contact is disposed on the semiconductor region and includes a seed material stack in contact with the semiconductor region. The seed material stack includes a first conductive layer having a majority of a first metal species and disposed on the semiconductor region. The seed material stack also includes a second conductive layer having a majority of the first metal species and disposed on the first conductive layer. A discontinuity region is between the first conductive layer and the second conductive layer. The seed material stack includes a third conductive layer having a majority of a second, different, metal species and disposed on the second conductive layer. The second conductive layer further includes the second metal species but the first conductive layer is essentially free from the second metal species.

In accordance with one or more embodiments described herein, multi-layer sputtered seed stacks are described for preventing upper conductive layer penetration. For example, a new metal stack may be implemented into a solar cell process sequence, the metal stack including Aluminum/Silicon (AlSi) and Nickel/Vanadium (NiV) conductive seed layers. One challenge is to prevent the Ni from reaching the wafer surface which can otherwise reduce rear surface reflectivity and cell efficiency. In one or more embodiments of the present disclosure, at least two sputter targets are used to apply the aluminum layer as generated in two or more distinct layers. In one embodiment, the Ni preferentially alloys with an upper Al layer, stopping at an interface between aluminum layers. To provide context, short-circuit current density (Jsc) may be undesirably lowered if Ni reaches the wafer surface.

In an embodiment, it is understood that the grain boundaries at the interface may be disrupted due to using a second sputter target. Such disruption may prevent penetration during upper level alloying. In one such embodiment, the possibility of decreasing total metal thickness may be viable since the inclusion of an interface can be used to prevent lower regions of the Al from to inter-diffusing with an upper Ni layer. Another advantage may include that by using two different Al layers, the Si percentage (as a secondary target species) may be set different for the inner and outer layer.

For example, the Si percentage for the outer layer facing the NiV could be set to as low as 0%.

In an embodiment, as described in greater detail below, more than one aluminum (Al) target is used for complete deposition of an aluminum seed film. In an embodiment, as is also described in greater detail below, a multi-layer sputtered aluminum stack prevents nickel (Ni) penetration from occurring through the entire aluminum stack.

As a general overview of an application of embodiments described herein, FIGS. 1A-1E illustrate cross-sectional views of various operations in a method of fabricating a conductive contact for a solar cell, in accordance with an embodiment of the present disclosure.

FIG. 1A illustrates a stage in solar cell fabrication following sputtering of a first conductive seed layer on a semiconductor region disposed in or above a substrate.

Referring to FIG. 1A and to corresponding operation 202 of flowchart 200, a method of fabricating a solar cell involves sputtering a first conductive seed layer 104 on a semiconductor region disposed in or above a substrate 102. In one embodiment, the first conductive seed layer 104 is formed on an emitter region disposed above a substrate, as described in greater detail below in association with FIGS. 3A and 4A-4C. The emitter region can be composed of, e.g., a doped polycrystalline silicon layer. In another embodiment, however, the first conductive seed layer 104 is formed on a surface of an N-type or P-type doped region of a bulk crystalline silicon substrate, as described in greater detail below in association with FIG. 3B. The bulk crystalline silicon substrate can be, e.g., an N-type bulk crystalline silicon substrate.

In an embodiment, the first conductive seed layer 104 includes a majority of a first metal species. In a specific embodiment, the first metal species is aluminum and the first conductive seed layer 104 is sputtered from a first target including approximately 99% aluminum and approximately 1% silicon.

It is to be appreciated that the first conductive seed layer 104 (and subsequent layers described below) may be formed as a blanket layer, e.g., by blanket deposition. In one embodiment, the first conductive seed layer 104 (and subsequent layers described below) is ultimately patterned in a lithography and etch patterning process. In another embodiment, the first conductive seed layer 104 (and subsequent layers described below) is ultimately patterned in a lift-off process. In FIGS. 1A-1E, deposited layers are shown as already patterned in for simplification.

In an embodiment, not shown, prior to forming the first conductive seed layer 104 on an emitter region above or within substrate 102, a dielectric stack is formed above the emitter region. An opening is formed in the dielectric stack to expose a portion of the emitter region by using laser ablation. An exemplary embodiment is described in association with FIGS. 4A-4C.

Figure 1B:
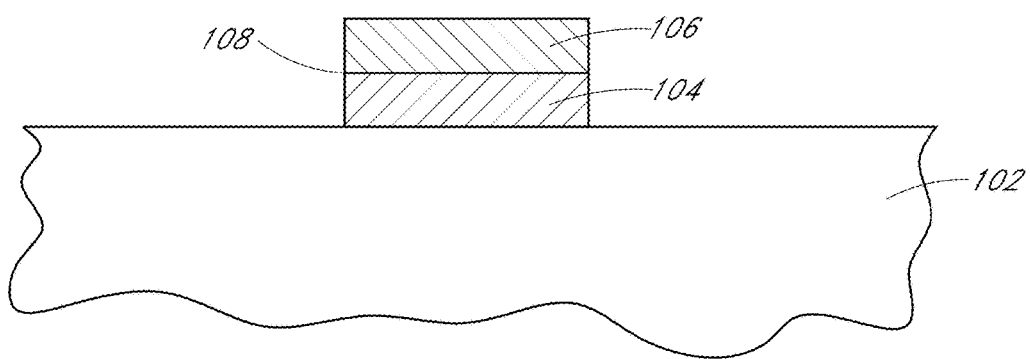

FIG. 1B illustrates the structure of FIG. 1A following sputtering of a second conductive seed layer on the first conductive seed layer.

Referring to FIG. 1B and to corresponding operation 204 of flowchart 200, the method of fabricating the solar cell further involves sputtering a second conductive seed layer 106 on the first conductive seed layer 104.

In an embodiment, the second conductive seed layer 106 includes a majority of the first metal species. In an embodiment, sputtering the second conductive seed layer 106 involves using a sputtering process having a different temperature, pressure, or both, than the sputtering process used for sputtering the first conductive seed layer 104. Nonetheless, in an embodiment, the target used for sputtering the second conductive seed layer 106 is the same or substantially the same in composition as the target used to sputter the first conductive seed layer 104. For example, in a specific embodiment, the first metal species is aluminum and the second conductive seed layer 106 is sputtered from the first target or from a second target including approximately 99% aluminum and approximately 1% silicon.

In an embodiment, a crystalline interface 108 is formed with the first conductive seed layer 104, e.g., between the second conductive seed layer 106 and the first conductive seed layer 104. In an embodiment, the crystalline interface 108 is formed as a result of a differing crystallinity between the first and second conductive layers 104 and 106. In one such embodiment, the crystallinity of the first conductive seed layer 104 and the crystallinity of the second conductive seed layer 106 differ in orientation, grain size, or both.

Figure 1C:
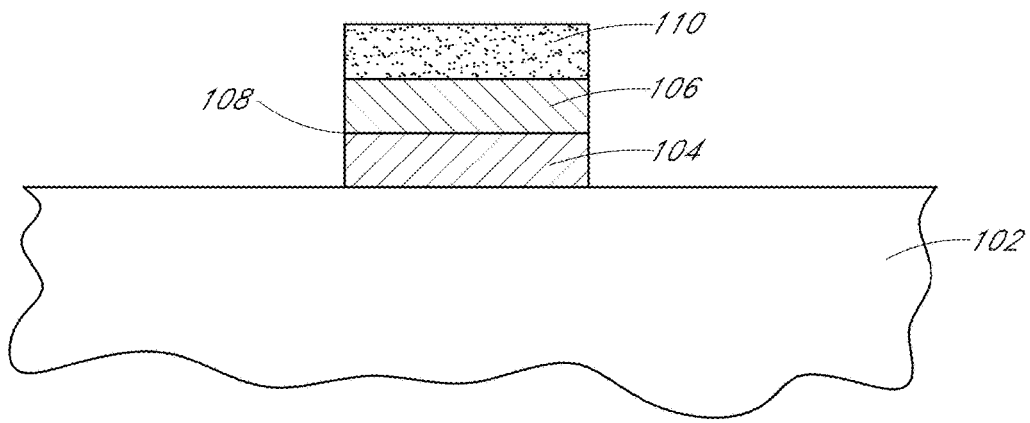

FIG. 1C illustrates the structure of FIG. 1B following sputtering of a third conductive seed layer on the second conductive seed layer.

Referring to FIG. 1C and to corresponding operation 206 of flowchart 200, the method of fabricating the solar cell further involves sputtering a third conductive seed layer 110 on the second conductive seed layer 106.

In an embodiment, the third conductive seed layer 110 includes a majority of a second metal species, different than the first metal species. In one such embodiment, the first metal species is aluminum, and the second metal species is nickel. In a specific such embodiment, the third conductive seed layer 110 is sputtered from a third target including approximately 93% nickel and 7% vanadium. In another embodiment, the first metal species is nickel, and the second metal species is copper.

Figure 1D:
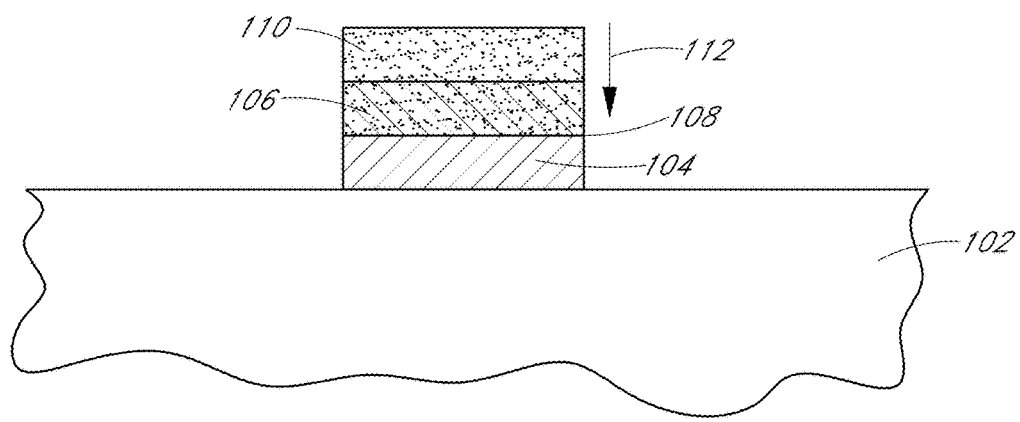

FIG. 1D illustrates the structure of FIG. 1C following annealing of the first, second, and third conductive seed layers.

Referring to FIG. 1D and to corresponding operation 208 of flowchart 200, the method of fabricating the solar cell further involves annealing the first 104, second 106, and third conductive seed layers 110. In an embodiment, the annealing drives the second metal species from the third conductive seed layer 110 into the second conductive seed layer 106, e.g., in the direction of arrow 112 in FIG. 1D. However, essentially none of the second metal species is driven into the first conductive seed layer 104.

In an embodiment, the crystalline interface 108 acts to inhibit, or altogether entirely block, penetration of the second metal species into the first conductive seed layer 104. In an embodiment, the annealing is performed at a temperature approximately in the range of 325-375 degrees Celsius. In a specific embodiment, the annealing is performed at a temperature of approximately 350 degrees Celsius.

Figure 1E:
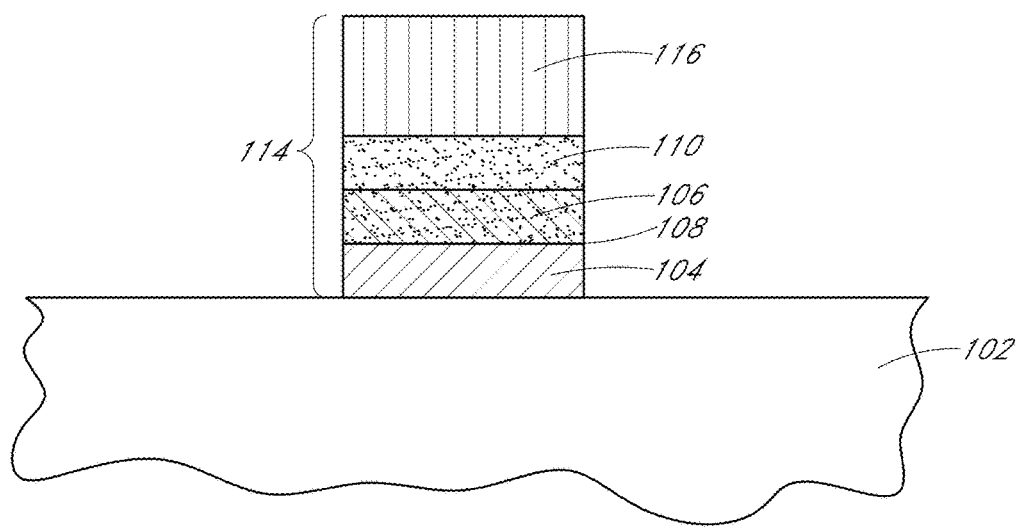
Figure 2:
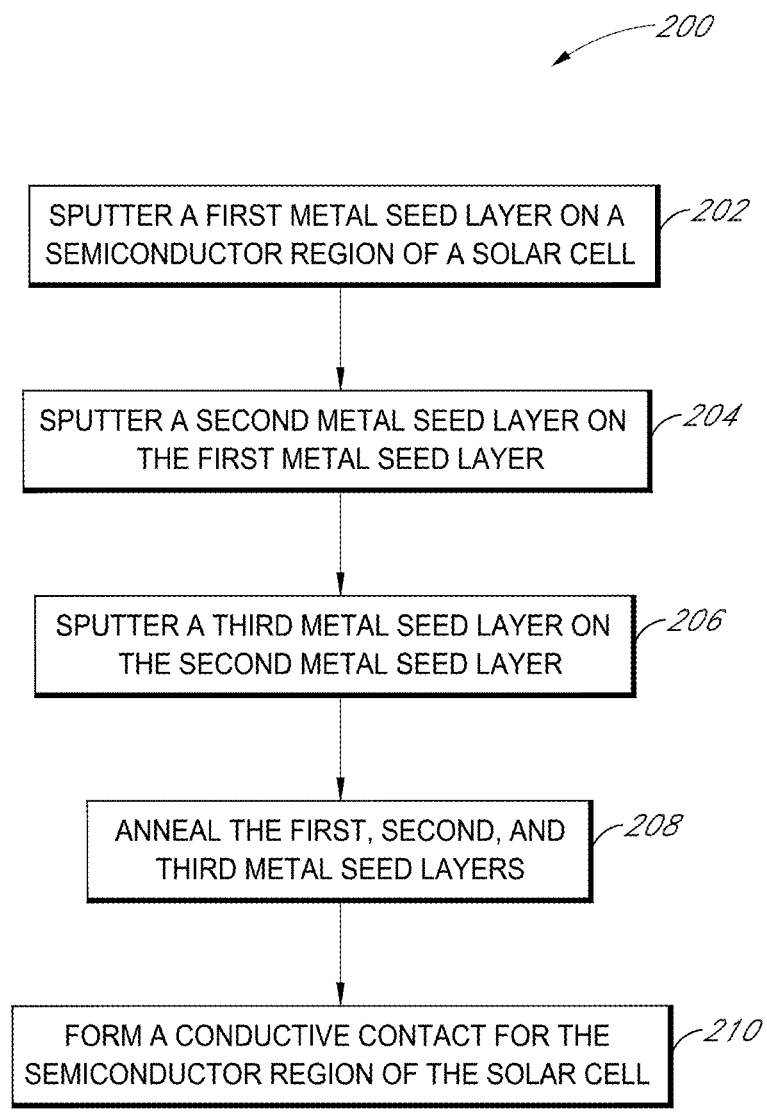
FIG. 2 is a flowchart listing operations in a method of fabricating a solar cell as corresponding to FIGS. 1A-1E, in accordance with an embodiment of the present disclosure.

FIG. 1E illustrates the structure of FIG. 1D following forming of a conductive contact for the semiconductor region of the solar cell, the conductive contact including the first, second, and third conductive seed layers.

Referring to FIG. 1E and to corresponding operation 210 of flowchart 200, the method of fabricating the solar cell further involves forming a conductive contact 114 for the semiconductor region of the solar cell including the first 104, second 106, and third 110 conductive seed layers.

In an embodiment, the conductive contact 114 is completed by forming a metal layer 116 on the third conductive seed layer 110, as is depicted in FIG. 1E. In one such embodiment, the metal layer 116 is formed in a sputtering process or in a plating process, such as an electro-plating process. In an exemplary such embodiment, the above described first metal species is aluminum, the second metal species is nickel, and forming the conductive contact 114 involves plating a copper layer (e.g., layer 116) on the third conductive seed layer 110. In other embodiment, instead of plating a copper layer, a copper layer is sputtered on the third conductive seed layer 110. In one such embodiment, the sputtered copper may be formed prior to performing an anneal of the sputter deposited stack of materials. That is, such a copper layer may be sputtered prior to performing annealing operation 208.

In an embodiment, a conductive back-contact 114 is formed for an emitter region disposed above a substrate of the solar cell, e.g., on a polysilicon region, as described in greater detail below in association with FIGS. 3A and 4A-4C. In another embodiment, a conductive back-contact is formed for an N-type or P-type doped region of the substrate 102, as described in greater detail below in association with FIG. 3B.

As described above, sputtered conductive layers can be used to ultimately fabricate conductive contacts, such as back-side contacts, for a solar cell having emitter regions formed above a substrate of the solar cell. For example, FIG. 3A illustrates a cross-sectional view of a portion of a solar cell having conductive contacts formed on emitter regions formed above a substrate, in accordance with an embodiment of the present disclosure.

Figure 3A:
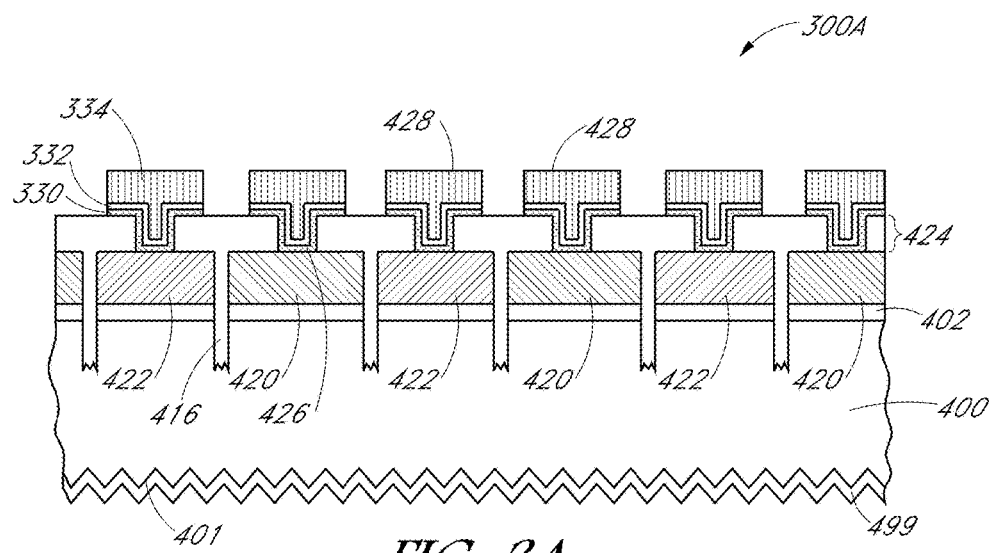
FIG. 3A illustrates a cross-sectional view of a portion of a solar cell having conductive contacts formed on emitter regions formed above a substrate, in accordance with an embodiment of the present disclosure.

Referring to FIG. 3A, a portion of a solar cell 300A includes a patterned insulating layer 424 disposed above a plurality of n-type doped polysilicon regions 420, a plurality of p-type doped polysilicon regions 422, and on portions of a substrate 400 exposed by trenches 416. Conductive contacts 428 are disposed in a plurality of contact openings disposed in the insulating layer 424 and are coupled to the plurality of n-type doped polysilicon regions 420 and to the plurality of p-type doped polysilicon regions 422. The materials of, and methods of fabricating, the patterned insulating layer 424, the plurality of n-type doped polysilicon regions 420, the plurality of p-type doped polysilicon regions 422, the substrate 400, and the trenches 416 may be as described below in association with FIGS. 4A-4C.

The plurality of n-type doped polysilicon regions 420 and the plurality of p-type doped polysilicon regions 422 can, in one embodiment, provide emitter regions for the solar cell 300A. Thus, in an embodiment, the conductive contacts 428 are disposed on the emitter regions. In an embodiment, the conductive contacts 428 are back contacts for a back-contact solar cell and are situated on a surface of the solar cell opposing a light receiving surface 401 which may have one or more passivation layers 499 formed thereon. Furthermore, in one embodiment, the emitter regions are formed on a thin or tunnel dielectric layer 402, described in greater detail in association with FIG. 4A.

Referring again to FIG. 3A, each of the conductive contacts 428 includes a seed material stack 330/332 in contact with the corresponding semiconductor region 420 or 422. The seed material stack 330/332 includes a first conductive layer having a majority of a first metal species and disposed on the semiconductor region 420 or 422. The seed material stack 330/332 also includes a second conductive layer having a majority of the first metal species and disposed on and having a crystalline interface with the first conductive layer (the first conductive layer and second conductive layer are shown collectively as layer 330) with an interface shown by the dashed line therein). The seed material stack 330/332 also includes a third conductive layer 332 having a majority of a second, different, metal species and disposed on the second conductive layer.

In an embodiment, the second conductive layer (upper portion of 330) further includes the second metal species. However, in an embodiment, the first conductive layer (lower portion of 330) is essentially free from the second metal species. In an embodiment, the first conductive layer (lower portion of 330) includes a greater total atomic composition amount of the first metal species than the second conductive layer (upper portion of 330). In an embodiment, the conductive contact 428 further includes a fourth conductive layer 334 disposed on the seed material stack 330/332. In one such embodiment, the fourth conductive layer 334 includes a majority of a third metal species different from the first metal species and different from the second metal species. In a specific such embodiment, the first metal species is aluminum, the second metal species is nickel, and the third metal species is copper.

In an embodiment, the first metal species is aluminum, and the second metal species is nickel. In one such embodiment, the third conductive layer 332 has a total atomic concentration of greater than approximately 90% nickel, the second conductive layer (upper portion of 330) has a total atomic concentration of greater than approximately 75% aluminum and greater than approximately 15% nickel, and the first conductive layer (lower portion of 330) has a total atomic concentration of greater than approximately 95% aluminum. In a particular embodiment, the third conductive layer 332 has a total atomic concentration of approximately 93% nickel and 7% vanadium, the second conductive layer (upper portion of 330) has a total atomic concentration of approximately 80% aluminum and approximately 20% nickel, and the first conductive layer (lower portion of 330) has a total atomic concentration of approximately 99% aluminum and approximately 1% silicon.

In an embodiment, the seed material stack 330/332 includes a first aluminum layer (lower portion of 330) having a first crystallinity and disposed on the semiconductor layer 420 or 422, and a second aluminum layer (upper portion of 330) having a second crystallinity and disposed on and having an interface with the first aluminum layer. The first crystallinity is different from the second crystallinity. In one such embodiment, the first crystallinity and second crystallinity differ in orientation, grain size, or both. In an embodiment, the second aluminum layer (upper portion of 330) includes nickel, while the first aluminum layer (lower portion of 330) is essentially nickel-free.

As also described above, sputtered conductive layers can be used to ultimately fabricate conductive contacts, such as back-side contacts, for a solar cell having emitter regions formed in a substrate of the solar cell. For example, FIG. 3B illustrates a cross-sectional view of a portion of a solar cell having conductive contacts formed on emitter regions formed in a substrate, in accordance with another embodiment of the present disclosure.

Figure 3B:
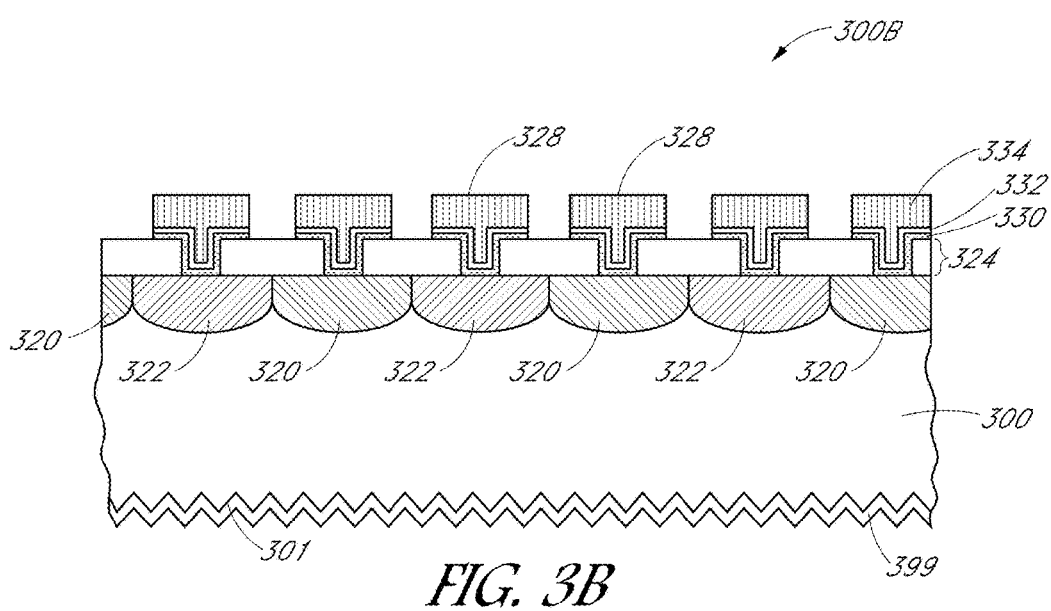
FIG. 3B illustrates a cross-sectional view of a portion of a solar cell having conductive contacts formed on emitter regions formed in a substrate, in accordance with another embodiment of the present disclosure.

Referring to FIG. 3B, a portion of a solar cell 300B includes a patterned insulating layer 324 disposed above a plurality of n-type doped diffusion regions 320, a plurality of p-type doped diffusion regions 322, and on portions of a substrate 300, such as a bulk crystalline silicon substrate. Conductive contacts 328 are disposed in a plurality of contact openings disposed in the insulating layer 324 and are coupled to the plurality of n-type doped diffusion regions 320 and to the plurality of p-type doped diffusion regions 322. In an embodiment, the diffusion regions 320 and 322 are formed by doping regions of a silicon substrate with n-type dopants and p-type dopants, respectively. Furthermore, the plurality of n-type doped diffusion regions 320 and the plurality of p-type doped diffusion regions 322 can, in one embodiment, provide emitter regions for the solar cell 300B. Thus, in an embodiment, the conductive contacts 328 are disposed on the emitter regions. In an embodiment, the conductive contacts 328 are back contacts for a back-contact solar cell and are situated on a surface of the solar cell opposing a light receiving surface, such as opposing a texturized light receiving surface 301 (which may have one or more passivation layers 399 formed thereon), as is depicted in FIG. 3B.

Referring again to FIG. 3B, each of the conductive contacts 328 includes a seed material stack 330/332 in contact with the corresponding diffusion region 320 or 322. The seed material stack 330/332 includes a first conductive layer having a majority of a first metal species and disposed on the semiconductor diffusion region 320 or 322. The seed material stack 330/332 also includes a second conductive layer having a majority of the first metal species and disposed on and having a crystalline interface with the first conductive layer (the first conductive layer and second conductive layer are shown collectively as layer 330 with an interface shown by the dashed line therein). The seed material stack 330/332 also includes a third conductive layer 332 having a majority of a second, different, metal species and disposed on the second conductive layer. In an embodiment, the conductive contact 328 further includes a fourth conductive layer 334 disposed on the seed material stack 330/332, as is depicted in FIG. 3B.

As described in association with FIG. 3A, the formed conductive contacts need not be formed directly on a bulk substrate, as was otherwise described in FIG. 3B. For example, in one embodiment, conductive contacts such as those described above are formed on semiconducting regions formed above (e.g., on a back side of) a bulk substrate. As an example of a fabrication scheme, FIGS. 4A-4C illustrate cross-sectional views of various processing operations in a method of fabricating solar cells having conductive contacts, in accordance with an embodiment of the present disclosure.

Figure 4A:
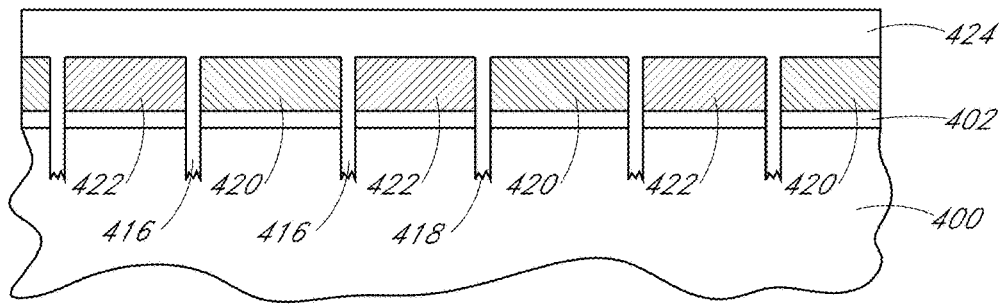
FIGS. 4A-4C illustrate cross-sectional views of various processing operations in a method of fabricating solar cells having conductive contacts, in accordance with an embodiment of the present disclosure.
Figure 4B:
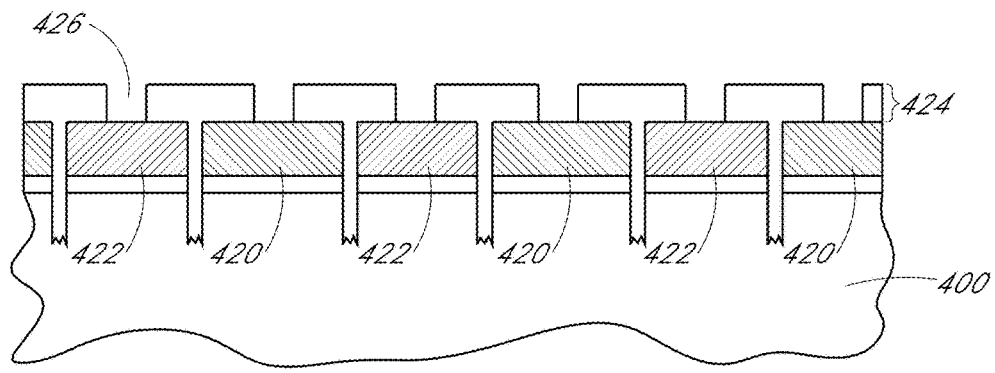
Figure 4C:
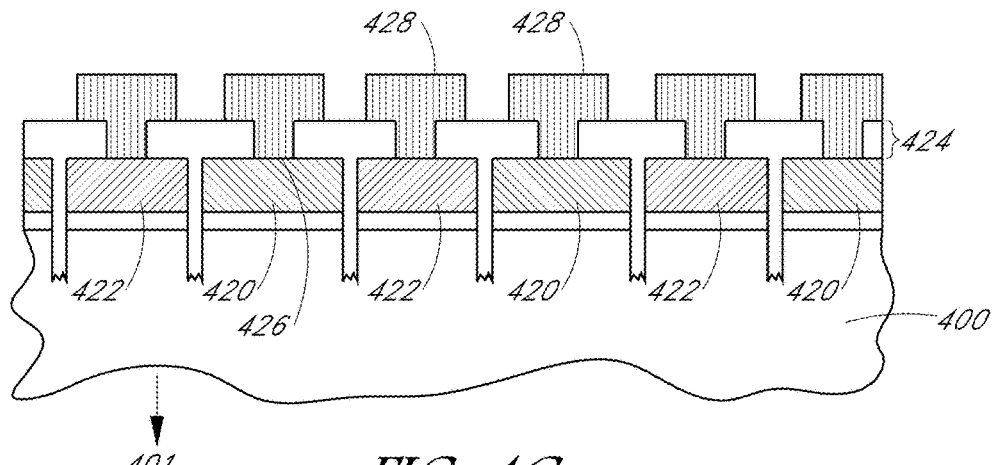

Referring to FIG. 4A, a method of forming contacts for a back-contact solar cell includes forming a thin dielectric layer 402 on a substrate 400.

In an embodiment, the thin dielectric layer 402 is composed of silicon dioxide and has a thickness approximately in the range of 5-50 Angstroms. In one embodiment, the thin dielectric layer 402 ultimately performs as a tunneling oxide layer in a functioning solar cell. In an embodiment, substrate 400 is a bulk single-crystal substrate, such as an n-type doped single crystalline silicon substrate. However, in an alternative embodiment, substrate 400 includes a polycrystalline silicon layer disposed on a global solar cell substrate.

Referring again to FIG. 4A, trenches 416 are formed between n-type doped polysilicon regions 420 and p-type doped polysilicon regions 422. Portions of the trenches 416 can be texturized to have textured features 418, as is also depicted in FIG. 4A.

Referring again to FIG. 4A, a insulating layer 424 is formed above the plurality of n-type doped polysilicon regions 420, the plurality of p-type doped polysilicon regions 422, and the portions of substrate 400 exposed by trenches 416. In one embodiment, a lower surface of the insulating layer 424 is formed conformal with the plurality of n-type doped polysilicon regions 420, the plurality of p-type doped polysilicon regions 422, and the exposed portions of substrate 400, while an upper surface of insulating layer 424 is substantially flat, as depicted in FIG. 4A.

Referring to FIG. 4B, a plurality of contact openings 426 are formed in the insulating layer 424. The plurality of contact openings 426 provide exposure to the plurality of n-type doped polysilicon regions 420 and to the plurality of p-type doped polysilicon regions 422. In one embodiment, the plurality of contact openings 426 is formed by laser ablation. In one embodiment, the contact openings 426 to the n-type doped polysilicon regions 420 have substantially the same height as the contact openings to the p-type doped polysilicon regions 422, as depicted in FIG. 4B.

Referring to FIG. 4C, the method of forming contacts for the back-contact solar cell further includes forming conductive contacts 428 in the plurality of contact openings 426 and coupled to the plurality of n-type doped polysilicon regions 420 and to the plurality of p-type doped polysilicon regions 422. In an embodiment, the conductive contacts 428 are formed by processes described above in association with conductive contact 114. Thus, in an embodiment, conductive contacts 428 are formed on or above a surface of a bulk N-type silicon substrate 400 opposing a light receiving surface 401 of the bulk N-type silicon substrate 400. In a specific embodiment, the conductive contacts are formed on regions (422/420) above the surface of the substrate 400, as depicted in FIG. 4C. The fabrication of the conductive contacts can involve use of one or more sputtered conductive layers, as described above.

In one aspect, in accordance with one or more embodiments of the present disclosure, deposition mechanisms are sought in order to obtain a horizontal grain boundary limit along an entire aluminum stack. In one such embodiment, a horizontal grain boundary limit is achieved by performing two or three (or more) aluminum sputtering deposition processes. In an example, FIG. 5 illustrates a multi-sputtering deposition process, in accordance with an embodiment of the present disclosure.

Figure 5:
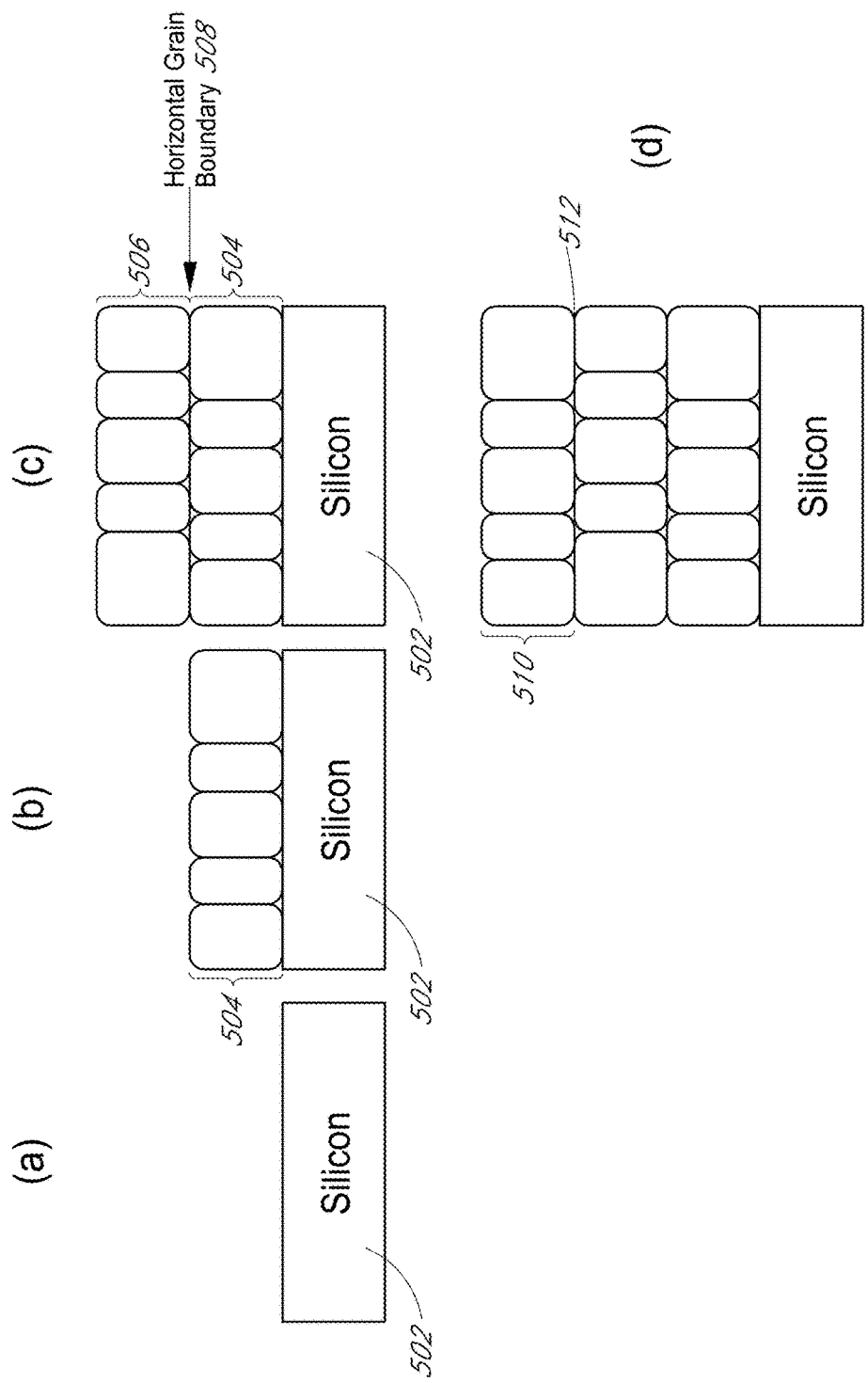
FIG. 5 illustrates a multi-sputtering deposition process, in accordance with an embodiment of the present disclosure.

Referring to part (a) of FIG. 5, a silicon substrate or emitter region 502 is provided. In part (b), a first aluminum layer 504 is deposited. The deposition conditions (e.g., deposition speed rate, the temperature, etc.) provide for grains growth and crystallization in a polycrystalline structure, forming a first aluminum stack. Then, referring to part (c), a second aluminum deposition is performed to provide a second aluminum layer 506 on the top of the first aluminum layer 504. A horizontal grain boundary 508 is formed. The horizontal grain boundary 508 is, in one embodiment, a discontinuity in the microstructure between the aluminum layers 504 and 506. In accordance with an embodiment of the present disclosure, the horizontal grain boundary 508 provides a barrier to intermetallics propagation. Referring to part (d) of FIG. 5, additional layers of aluminum (such as layer 510) may be sputtered to provide additional horizontal grain boundaries (such as boundary 512).

Figure 6:
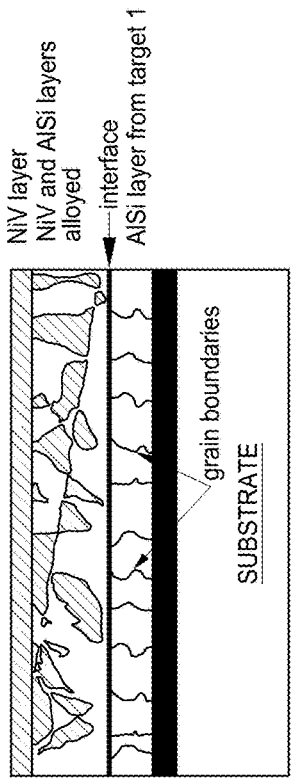
FIG. 6 is a schematic with cross-sectional views of a wafer having a AlSi/NiV metal stack post deposition (left) and post annealing (right), in accordance with an embodiment of the present disclosure.
Figure 6:
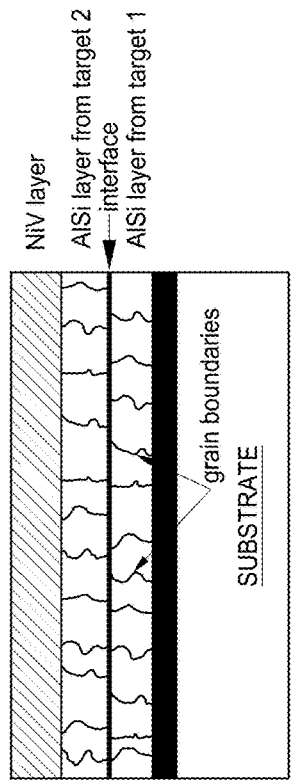

FIG. 6 is a schematic with cross-sectional views of a wafer having a AlSi/NiV metal stack post deposition (left) and post annealing (right), in accordance with an embodiment of the present disclosure.

In an embodiment, the use of two or more two or sputter sources and/or sputter operations for depositing an AlSi film can prevent overlying nickel (Ni) to reach the wafer surface. As shown in FIG. 6, on the left hand side, AlSi and NiV layers are deposited above a substrate or on a layer formed on a substrate. By using two different targets for depositing the AlSi layer, an interface in between the AlSi layers forms which disrupts the columnar grain boundaries. After annealing at temperatures around 350 degrees Celsius, the Ni and the Al are alloyed, forming intermetallics as can be seen on the right side of FIG. 6. However, the formation of intermetallics stops at the interface leaving a lower AlSi layer essentially nickel-free.

Figure 7:
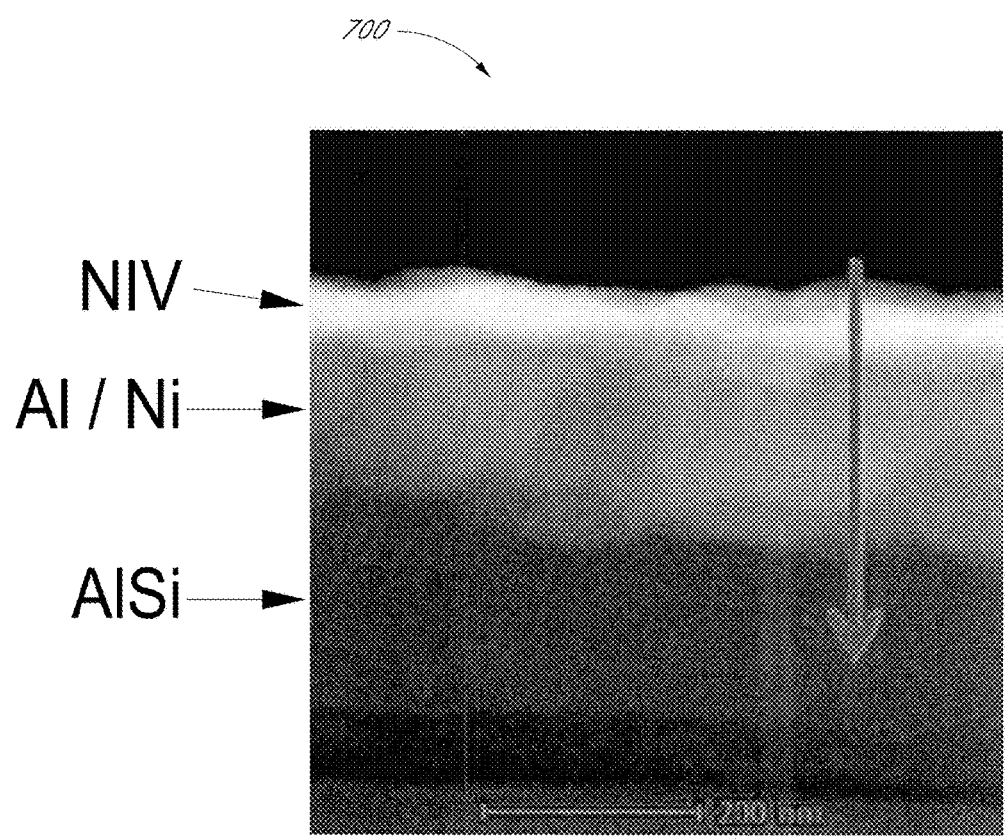
FIG. 7 is a cross-sectional transmission electron micrograph (TEM) image of a device, in accordance with an embodiment of the present disclosure.
Figure 8:
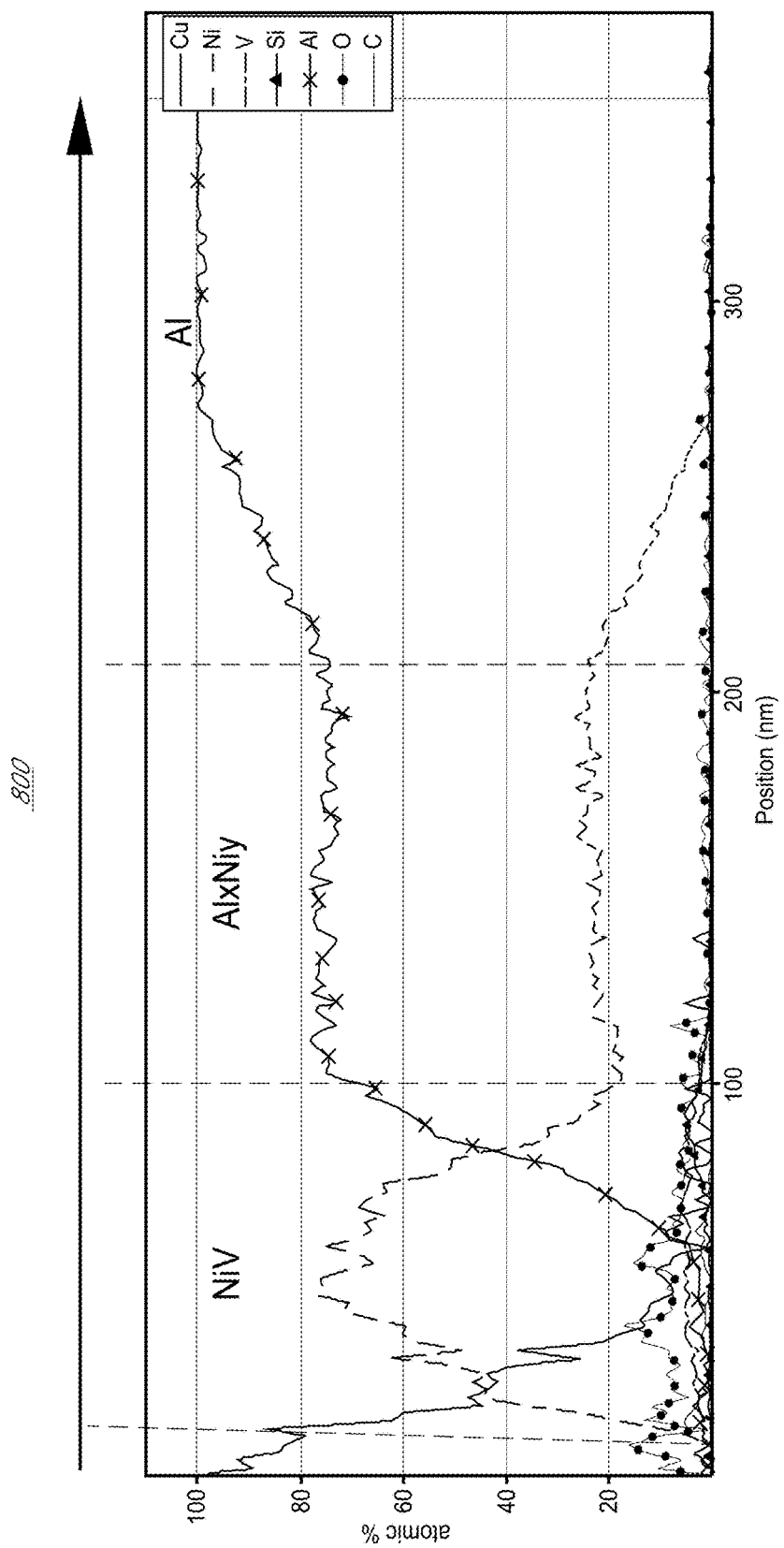
FIG. 8 is a plot of elemental analysis of an EDX linescan along the direction of the arrow depicted in FIG. 7, in accordance with an embodiment of the present disclosure.

FIG. 7 is a cross-sectional transmission electron micrograph (TEM) image 700 of a device, in accordance with an embodiment of the present disclosure. FIG. 8 is a plot 800 of elemental analysis of an EDX linescan along the direction of the arrow depicted in FIG. 7, in accordance with an embodiment of the present disclosure. Referring collectively to FIGS. 7 and 8, intermetallic formation stops in the middle of the aluminum layer.

In other embodiments, a measurable distinction or interruption in crystallinity between two sputtered layers need not be present in order to benefit from a multiple sputtering operation processing scheme. For example, in an embodiment, an aspect of discontinuity is present between two like- or similar-material sputtered layers. The discontinuity may be an impurity layer or surface that forms between sputtering operations and may ultimately be incorporated into a contact of a solar cell. In an exemplary embodiment, a solar cell includes a substrate. A semiconductor region is disposed in or above the substrate. A conductive contact is disposed on the semiconductor region and includes a seed material stack in contact with the semiconductor region. The seed material stack includes a first conductive layer having a majority of a first metal species and disposed on the semiconductor region. The seed material stack also includes a second conductive layer having a majority of the first metal species and disposed on the first conductive layer. A discontinuity region is between the first conductive layer and the second conductive layer. The seed material stack includes a third conductive layer having a majority of a second, different, metal species and disposed on the second conductive layer. The second conductive layer further includes the second metal species but the first conductive layer is essentially free from the second metal species. In one such embodiment, the discontinuity region is an impurity layer.

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. In other embodiments, plated or like-deposited cobalt (Co) or tungsten (W) can be used instead of or in addition to the plated copper described above. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, multi-layer sputtered metal seed for solar cell conductive contacts and methods of forming solar cell conductive contacts have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
a substrate;
a semiconductor region disposed in or above the substrate; and
a conductive contact disposed on the semiconductor region and comprising a seed material stack in contact with the semiconductor region, wherein the seed material stack comprises a first aluminum layer having a first crystallinity and disposed on the semiconductor region, and a second aluminum layer having a second crystallinity and disposed on and having an interface with the first aluminum layer, wherein the first crystallinity is different from the second crystallinity, wherein the seed material stack further comprises a nickel layer disposed on the second aluminum layer, wherein the nickel layer has a total atomic concentration of greater than approximately 90% nickel, the second aluminum layer has a total atomic concentration of greater than approximately 75% aluminum and greater than approximately 15% nickel, and wherein the first aluminum layer has a total atomic concentration of greater than approximately 95% aluminum.

2. The solar cell of claim 1, wherein the first crystallinity and the second crystallinity differ in grain size.

3. The solar cell of claim 1, wherein the second aluminum layer comprises nickel, and the first aluminum layer is essentially nickel-free.

4. The solar cell of claim 1, wherein the nickel layer has a total atomic concentration of approximately 93% nickel and 7% vanadium, the second aluminum layer has a total atomic concentration of approximately 80% aluminum and approximately 20% nickel, and wherein the first aluminum layer has a total atomic concentration of approximately 99% aluminum and approximately 1% silicon.

5. The solar cell of claim 1, wherein the conductive contact further comprises a copper layer disposed on the seed material stack.

6. The solar cell of claim 1, wherein the semiconductor region is a polycrystalline silicon layer of an emitter region disposed above the substrate.

7. The solar cell of claim 1, wherein the semiconductor region is a diffusion region disposed in the substrate, and wherein the substrate is a monocrystalline silicon substrate.

8. The solar cell of claim 1, wherein the solar cell is a back-contact solar cell.

* * * * *